(12) United States Patent
Yamaoka et al.

(10) Patent No.: US 8,067,811 B2
(45) Date of Patent: Nov. 29, 2011

(54) MEMS DEVICE, MEMS DEVICE MODULE AND ACOUSTIC TRANSDUCER

(75) Inventors: Tohru Yamaoka, Osaka (JP); Yuichi Miyoshi, Niigata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/938,007

(22) Filed: Nov. 2, 2010

(65) Prior Publication Data

US 2011/0042763 A1      Feb. 24, 2011

Related U.S. Application Data

(63) Continuation of application No. 12/622,975, filed on Nov. 20, 2009, now Pat. No. 7,847,359, which is a continuation of application No. PCT/JP2009/001811, filed on Apr. 21, 2009.

(30) Foreign Application Priority Data

Jun. 24, 2008   (JP) ................................ 2008-164788

(51) Int. Cl.
*H01L 21/00* (2006.01)
*H04R 25/00* (2006.01)

(52) U.S. Cl. ............ 257/416; 257/414; 438/50; 438/53; 381/174

(58) Field of Classification Search .................. 257/416
See application file for complete search history.

(56) References Cited

U.S. PATENT DOCUMENTS

| | | | |
|---|---|---|---|
| 4,332,000 A | 5/1982 | Petersen | |
| 4,524,247 A | 6/1985 | Lindenberger et al. | |
| 5,302,549 A | 4/1994 | Santangelo et al. | |
| 5,889,872 A | 3/1999 | Sooriakumar et al. | |
| 6,667,189 B1 | 12/2003 | Wang et al. | |
| 6,677,176 B2 | 1/2004 | Wong et al. | |
| 7,146,016 B2 * | 12/2006 | Pedersen ........................ 381/175 |
| 7,329,933 B2 * | 2/2008 | Zhe et al. ...................... 257/419 |
| 2001/0033670 A1 | 10/2001 | Tai et al. | |
| 2004/0253760 A1 * | 12/2004 | Zhang et al. .................... 438/53 |
| 2006/0291674 A1 | 12/2006 | Gong et al. | |
| 2007/0238215 A1 * | 10/2007 | Stewart et al. .................. 438/53 |

(Continued)

FOREIGN PATENT DOCUMENTS

JP      2000-508860      7/2000

(Continued)

OTHER PUBLICATIONS

Japanese Notice of Reasons for Rejections, with English translation, issued in Japanese Patent Application No. 2009-519738, dated Jul. 7, 2009.

(Continued)

*Primary Examiner* — Kenneth Parker
*Assistant Examiner* — Jose R Diaz
(74) *Attorney, Agent, or Firm* — McDermott Will & Emery LLP (57) ABSTRACT

A MEMS device includes a first insulating film formed on a semiconductor substrate, a vibrating film formed on the first insulating film, and a fixed film above the vibrating film with an air gap being interposed therebetween. The semiconductor substrate has a region containing N-type majority carriers. A concentration of N-type majority carriers in a portion of the semiconductor substrate where the semiconductor substrate contacts the first insulating film, is higher than a concentration of N-type majority carriers in the other portion of the semiconductor substrate.

12 Claims, 8 Drawing Sheets

U.S. PATENT DOCUMENTS

2007/0286438 A1    12/2007    Hirade et al.
2008/0175417 A1    7/2008    Kok et al.

FOREIGN PATENT DOCUMENTS

| | | |
|---|---|---|
| JP | 2002-027595 | 1/2002 |
| JP | 2005-191208 | 7/2005 |
| JP | 2006-242684 | 9/2006 |
| JP | 2007-295516 | 11/2007 |
| JP | 2008-113057 | 5/2008 |
| WO | WO 2006/124002 A1 | 11/2006 |

OTHER PUBLICATIONS

Notice of Allowance issued in U.S. Appl. No. 12/622,975, mailed on Sep. 17, 2010.

* cited by examiner

$1/C_a = 1/C_{air} + 1/C_i$

$$C_{mic} = C_a + \Delta C_a + C_p + \Delta C_p$$

$$C_{si} = (\varepsilon_{si} \cdot \varepsilon_0 / X_p) \cdot S$$

MEMS DEVICE, MEMS DEVICE MODULE AND ACOUSTIC TRANSDUCER

CROSS-REFERENCE TO RELATED APPLICATIONS

This application is a Continuation of U.S. patent application Ser. No. 12/622,975, filed on Nov. 20, 2009 now U.S. Pat. No. 7,847,359, which is a continuation of PCT International Application PCT/JP2009/001811 filed on Apr. 21, 2009, which claims priority to Japanese Patent Application No. 2008-164788 filed on Jun. 24, 2008. The disclosures of these applications including the specifications, the drawings, and the claims are hereby incorporated by reference in their entirety.

BACKGROUND

The present disclosure relates to MEMS devices, such as acoustic transducers and the like, which include a semiconductor substrate as a support substrate, and a movable electrode and a fixed electrode above the semiconductor substrate, and MEMS device modules including the MEMS devices.

MEMS (Micro-Electro-Mechanical Systems) devices to which semiconductor technologies are applied are a promising technology for reducing the size of and improving the performance of conventional electronic components. Significant achievements have already been made in the mass production of MEMS devices in the fields of microphones, acceleration sensors and the like, as disclosed in Japanese Patent Laid-Open Publication No. 2007-295516 and the like. In the mass production of these MEMS devices, a semiconductor substrate is employed as a support substrate so that a manufacturing line and a wafer process for fabricating a semiconductor integrated circuit can be utilized.

SUMMARY

However, the aforementioned MEMS devices, particularly capacitive devices such as acoustic transducers, are very likely to suffer from noise, variations in sensitivity, and the like.

In view of the foregoing, it is an object of the present disclosure to provide an MEMS device which is less likely to suffer from noise, variations in sensitivity, and the like.

In order to achieve the object, the present inventors have studied the cause of noise, variations in sensitivity, and the like being very likely to occur in MEMS devices, to find the following.

Specifically, when an MEMS device having an electrode structure is provided on a semiconductor substrate, a MIS (Metal Insulator Semiconductor) structure is readily formed to act as a parasitic capacitor. The present inventors have found that a potential varies due to displacement current caused by variations in the width of a depletion layer in the MIS structure, and as a result, noise, variations in sensitivity and the like occur in capacitive devices, such as acoustic transducers.

Specifically, the polarity of interface charge present at an interface of the semiconductor substrate in the MIS structure is the same as the polarity of majority carriers in the semiconductor substrate, a depletion layer is formed in the semiconductor substrate. The depletion layer acts as a portion of parasitic capacitance, and variations in the magnitude of the parasitic capacitance due to the formation of the depletion layer cause noise, which leads to problems, such as a reduction in S/N ratio characteristics and variations in sensitivity.

For example, in the presence of a light source which emits light at a predetermined frequency, such as a fluorescent lamp, a non-equilibrium state occurs in the MIS structure due to carrier generation and annihilation, so that the width of the depletion layer undergoes modulation, and therefore, the magnitude of the parasitic capacitance varies periodically. In capacitive devices such as acoustic transducers, the variation of the magnitude of the parasitic capacitance causes noise, leading to a reduction in S/N ratio characteristics.

Likewise, in the case of transfer between places having different illuminances or different temperatures, a non-equilibrium state occurs in the MIS structure due to carrier generation and annihilation, so that the width of the depletion layer undergoes modulation, and therefore, the magnitude of the parasitic capacitance varies. As a result, noise occurs. In particular, when an inexpensive and widely used p-type silicon substrate is employed as the support substrate of a capacitive device such as an acoustic transducer, positive charge caused by a small amount of aluminum or the like attached to a surface of the substrate during a substrate cleaning step or the like causes the positive charge forming a depletion layer, and therefore, the device is very likely to suffer from an influence of variations in the width of the depletion layer due to changes in temperature or light intensity.

The present disclosure has been made based on the aforementioned findings. Specifically, a MEMS device according to the present disclosure, includes a semiconductor substrate, a first insulating film formed on the semiconductor substrate, a vibrating film formed on the first insulating film and having a first electrode, a fixed film formed above the vibrating film with an air gap being interposed between the vibrating film and the fixed film, and having a second electrode, and a second insulating film provided between the semiconductor substrate and a portion of the fixed film. The semiconductor substrate has a region containing N-type majority carriers.

In the MEMS device of the present disclosure, the semiconductor substrate may be a silicon substrate.

In the MEMS device of the present disclosure, the semiconductor substrate and the first insulating film may be removed from a predetermined region, and the vibrating film may be formed, covering the predetermined region.

In the MEMS device of the present disclosure, the semiconductor substrate may contact the first insulating film. The region containing N-type majority carrier may be provided in at least a portion of the semiconductor substrate where the semiconductor substrate contacts the first insulating film. In this case, a concentration of N-type majority carriers in the portion of the semiconductor substrate where the semiconductor substrate contacts the first insulating film, is preferably higher than a concentration of N-type majority carriers in the other portion of the semiconductor substrate.

In the MEMS device of the present disclosure, the region containing N-type majority carriers may contain an N-type impurity. Specifically, a concentration of the N-type impurity is preferably $1 \times 10^{14} \, \text{cm}^{-3}$ or more and $1 \times 10^{21} \, \text{cm}^{-3}$ or less. In this case, the N-type impurity may be a phosphorus atom or an arsenic atom.

In the MEMS device of the present disclosure, the semiconductor substrate may be an N-type semiconductor substrate.

In the MEMS device of the present disclosure, the first insulating film may be a silicon oxide film.

In the MEMS device of the present disclosure, the second insulating film may be a silicon oxide film.

In the MEMS device of the present disclosure, a height of the air gap may be substantially equal to a separation between the vibrating film and the fixed film.

Also, a MEMS device module according to the present disclosure includes the MEMS device of the present disclosure, and a cover provided above the MEMS device and having an acoustic hole.

The MEMS device module of the present disclosure may further include an amplifier electrically coupled to the MEMS device.

Also, an acoustic transducer according to the present disclosure includes a semiconductor substrate, a movable electrode formed above the semiconductor substrate, a fixed electrode formed above the semiconductor substrate, a first insulating film provided between the semiconductor substrate and a portion of the movable electrode, and a second insulating film provided between the semiconductor substrate and a portion of the fixed electrode. The semiconductor substrate, the first insulating film and the movable electrode constitute the first MIS structure. The semiconductor substrate, the second insulating film and the fixed electrode constitute the second MIS structure. Interface charge having the first polarity is present at an interface between the semiconductor substrate and at least one of the first insulating film and the second insulating film. The semiconductor substrate has majority carriers having the second polarity.

In the acoustic transducer of the present disclosure, the semiconductor substrate may be a silicon substrate having a region containing N-type majority carriers. In this case, the silicon substrate may contact the first insulating film. The region containing N-type majority carriers may be provided in at least a portion of the silicon substrate in which the silicon substrate contacts the first insulating film. Specifically, a concentration of N-type majority carriers in the portion of the semiconductor substrate where the semiconductor substrate contacts the first insulating film, may be higher than a concentration of N-type majority carriers in the other portion of the semiconductor substrate. Also, in this case, the silicon substrate may be an N-type silicon substrate.

In the acoustic transducer of the present disclosure, the movable electrode and the fixed electrode may constitute a condenser structure. A capacitance of the condenser structure may vary due to vibration of the movable electrode which is caused in response to sound pressure.

According to the present disclosure, in MEMS devices such as acoustic transducers and the like, a region containing N-type majority carriers is provided in a semiconductor substrate as a support substrate, whereby it is possible to substantially prevent a depletion layer from being formed in a parasitic MIS structure due to fixed positive charge caused by aluminum contamination or the like occurring during a typical integrated circuit fabrication process. As a result, it is possible to substantially prevent noise, variations in sensitivity and the like from occurring due to variations in capacitance.

As described above, the present disclosure relates to MEMS devices, such as acoustic transducers and the like. A region containing N-type majority carriers is provided in a semiconductor substrate as a support substrate, whereby it is advantageously possible to substantially prevent, for example, the occurrence of noise due to variations in parasitic capacitance. Therefore, high-performance and high-quality MEMS devices which are fabricated using a silicon wafer or the like can be widely supplied to the market.

DETAILED DESCRIPTION

Embodiment

An acoustic transducer according to an embodiment of the present disclosure will be described hereinafter with reference to the accompanying drawings.

Figure 1:
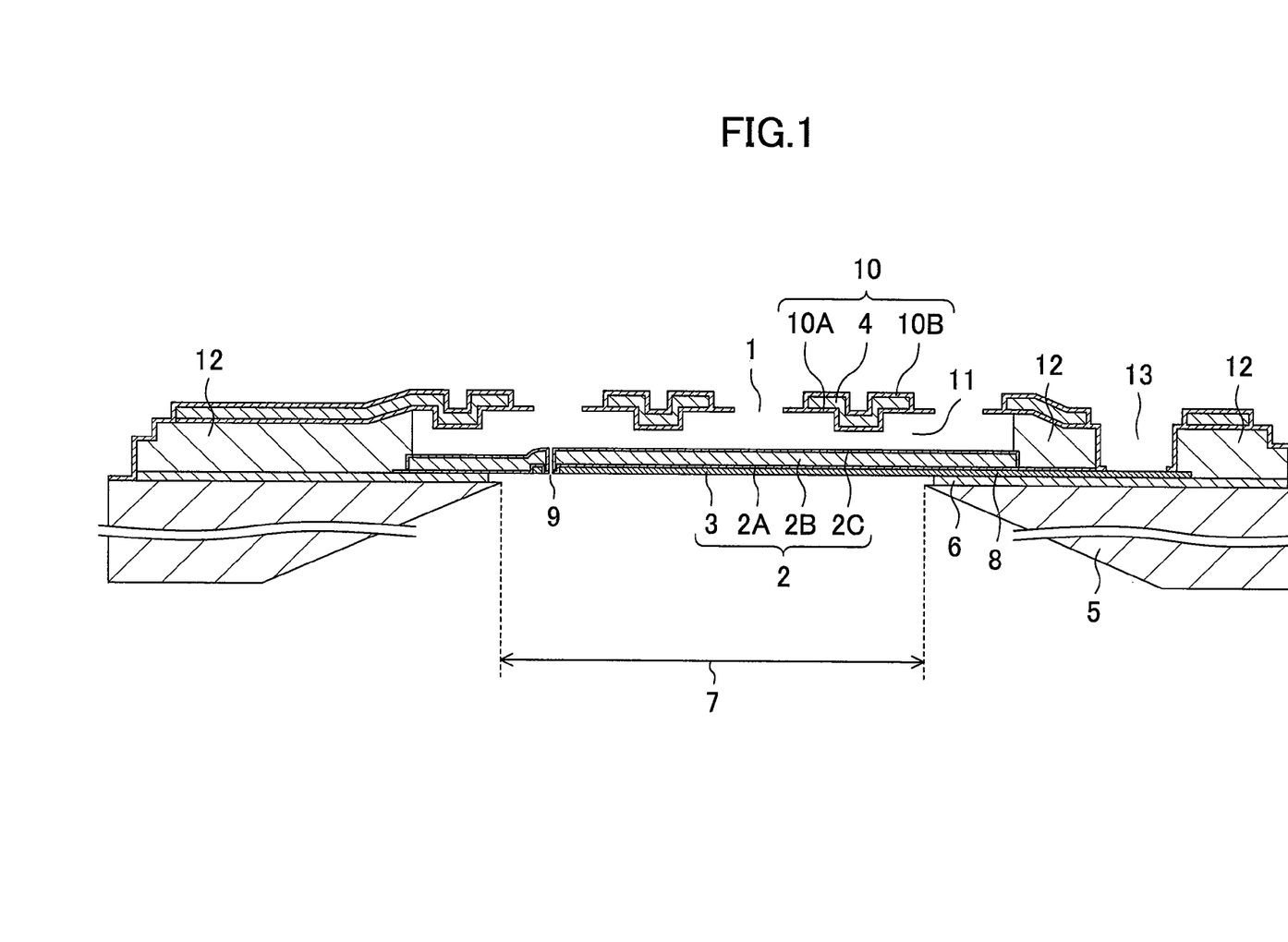
FIG. 1 is a cross-sectional view of an acoustic transducer according to an embodiment of the present disclosure.

FIG. 1 is a cross-sectional view showing the acoustic transducer of this embodiment.

As shown in FIG. 1, a silicon oxide film 6 is formed on an N-type silicon substrate 5 which is a support substrate. A multilayer structure of the silicon substrate 5 and the silicon oxide film 6 is removed to form a membrane region (substrate removed region) 7, leaving a portion thereof surrounding the membrane region 7. Specifically, the membrane region 7 is a region which is formed by selectively removing the silicon substrate 5 (leaving a portion of the silicon substrate 5 surrounding the membrane region 7) so that a vibrating film 2 described below can be vibrated by external pressure. The vibrating film 2 is formed on the silicon oxide film 6, covering the membrane region 7. A leak hole 9 which penetrates to the cavity of the membrane region 7 is formed in the vibrating film 2. The vibrating film 2 may be constituted of a conductive film, a lower electrode (vibrating electrode), or a multilayer film including the conductive film and an insulating film. In particular, when the vibrating film 2 includes an electret film, which holds permanent charge, the vibrating film 2 can form a portion of an electret condenser. In this embodiment, the vibrating film 2 includes a lower electrode 3 made of a conductive film such as a polysilicon film or the like, an insulating film 2B made of a silicon oxide film or the like formed above the lower electrode 3, and insulating films 2A and 2C made of a silicon nitride film or the like which cover a lower surface and an upper surface (including side surfaces) of the insulating film 2B, respectively. Also, a lead wire 8 made of the conductive film included in the lower electrode 3 is formed on the silicon oxide film 6.

Also, a fixed film 10 is provided above the vibrating film 2. The fixed film 10 may be constituted of a conductive film, an upper electrode (fixed electrode), or a multilayer film which includes the conductive film and an insulating film. In particular, when the fixed film 10 includes an electret film, which holds permanent charge, the fixed film 10 can form a portion of an electret condenser. In this embodiment, the fixed film 10 includes an upper electrode 4 made of a conductive film such as a polysilicon film or the like, and insulating films 10A and 10B made of a silicon nitride film or the like which cover a lower surface and an upper surface (including side surfaces) of the upper electrode 4, respectively.

Also, a silicon oxide film 12 for supporting the fixed film 10 is formed above a portion of the vibrating film 2 and the silicon oxide film 6.

Also, an air gap 11 is provided and surrounded by the vibrating film 2, the fixed film 10 and the silicon oxide film 12. Note that the air gap 11 is formed, extending over an entire upper surface of the membrane region 7. In this embodiment, the air gap 11 is formed by removing a portion of the silicon oxide film 12. Also, the air gap 11 has a height (air gap length) which is equal to a separation between the vibrating film 2 and the fixed film 10.

Also, a plurality of acoustic holes 1 which penetrate to the air gap 11 are formed in the fixed film 10 on the air gap 11. The acoustic holes 1 serve as holes through which air which vibrates the vibrating film 2 passes.

Also, an opening 13 is formed in the silicon oxide film 12, exposing the lead wire 8 on the silicon oxide film 6. Although not shown, the lower electrode 3 is connected via the lead wire 8 to an external circuit.

Next, operation of the acoustic transducer of this embodiment will be described. In the acoustic transducer of this embodiment, when sound pressure is applied from above (outside) to the vibrating film 2 via the acoustic holes 1, the vibrating film 2 vertically vibrates in response to the sound pressure. Here, a parallel-plate condenser structure whose electrodes are the lower electrode 3 and the upper electrode 4 is formed. Therefore, when the vibrating film 2 vertically vibrates, a separation between the lower electrode 3 and the upper electrode 4 changes, and therefore, the capacitance (Ca) of the condenser changes. On the other hand, if it is assumed that the capacitance (Ca) changes (the amount of a change in the capacitance Ca is hereinafter referred to as ΔCa) under the condition that the amount of charge (Qa) accumulated in the condenser is constant, a voltage (Va) between the lower electrode 3 and the upper electrode 4 changes as indicated by expression (2) described below in accordance with a relationship indicated by expression (1) described below (the amount of a change in the voltage Va is hereinafter referred to as ΔVa).

$$Qa = Ca \times Va \tag{1}$$

$$\Delta Va = Qa/\Delta Ca \tag{2}$$

In other words, the vibration of air is converted into mechanical vibration, whereby a change in sound pressure is converted into a change in voltage. This is the operating principle of the acoustic transducer of this embodiment. However, in conventional acoustic transducers, various parasitic capacitances vary, and therefore, the aforementioned ideal voltage change cannot be obtained as an output.

Next, sensitivity which indicates a characteristic of acoustic transducers will be described. A general expression of the sensitivity S of an acoustic transducer in the audible range is represented by:

$$S = \alpha \times Ca \times Va \times P \times (1/S_0) \tag{3}$$

where α represents a proportionality factor, Ca represents an air gap capacitance (proportional to (air gap area/air gap length)) which is a variable portion, Va represents a voltage across the air gap, P represents sound pressure, and $S_0$ represents a stiffness (difficulty in movement) of the vibrating film. As can also be seen from expression (3), Ca is one of the main parameters on which the level of the sensitivity depends. However, in conventional acoustic transducers, various parasitic capacitances vary, and therefore, an ideal sensitivity characteristic cannot be achieved.

Advantages of the acoustic transducer of this embodiment over conventional acoustic transducers will be described hereinafter in terms of a capacitor (including parasitic capacitance) of each part of the acoustic transducer.

Initially, the capacitor at each part of the acoustic transducer of this embodiment will be described in detail.

Figure 2:
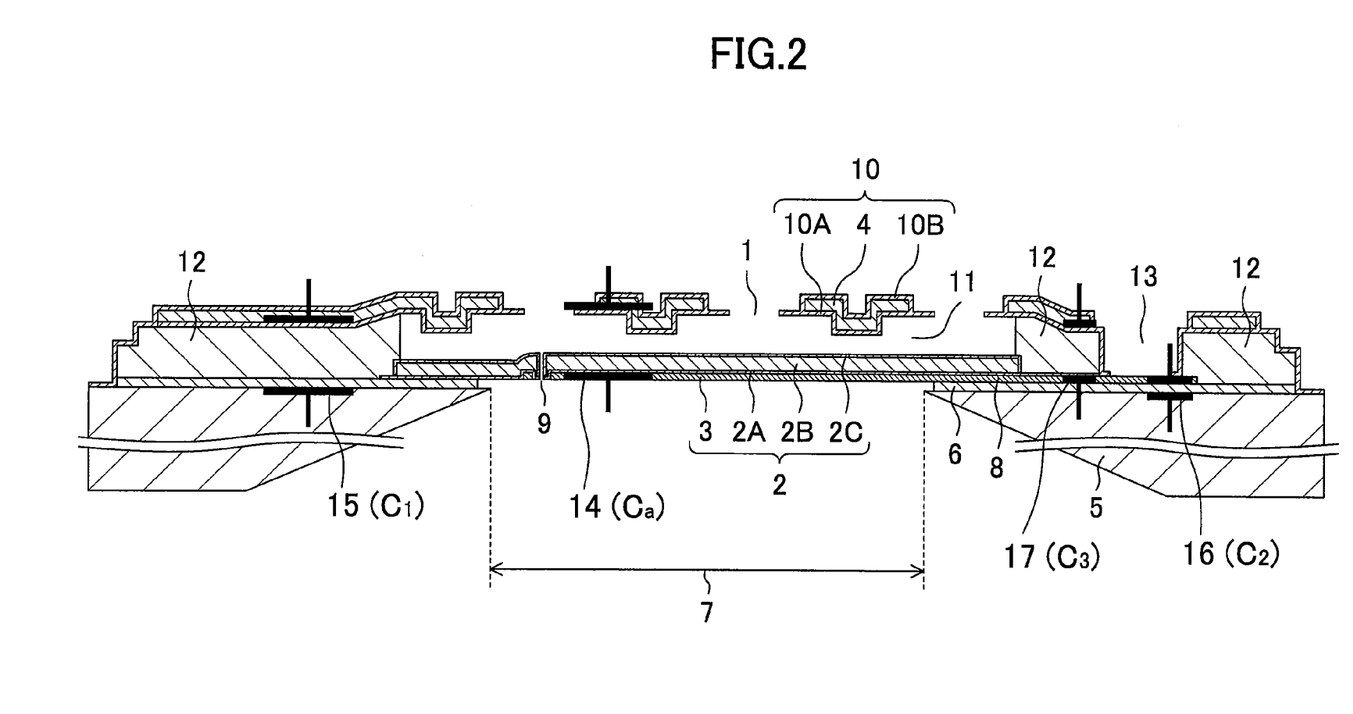
FIG. 2 is a cross-sectional view of the acoustic transducer of the embodiment of the present disclosure, schematically showing a capacitor at each part thereof.

FIG. 2 is a cross-sectional view of the acoustic transducer of this embodiment, schematically showing the capacitor at each part thereof. In FIG. 2, reference symbol 14 indicates a capacitor having an air gap capacitance Ca, reference symbol 15 indicates a parasitic capacitor (capacitance value $C_1$) of a MIS structure including the upper electrode 4, the silicon oxide film 12, the silicon oxide film 6 and the silicon substrate 5, reference symbol 16 indicates a parasitic capacitor (capacitance value $C_2$) of a MOS structure including the lower electrode 3, the silicon oxide film 6 and the silicon substrate 5, and reference symbol 17 indicates a parasitic capacitor (capacitance value $C_3$) of a MOS structure including the upper electrode 4, the silicon oxide film 12 and the lower electrode 3.

Figure 3:
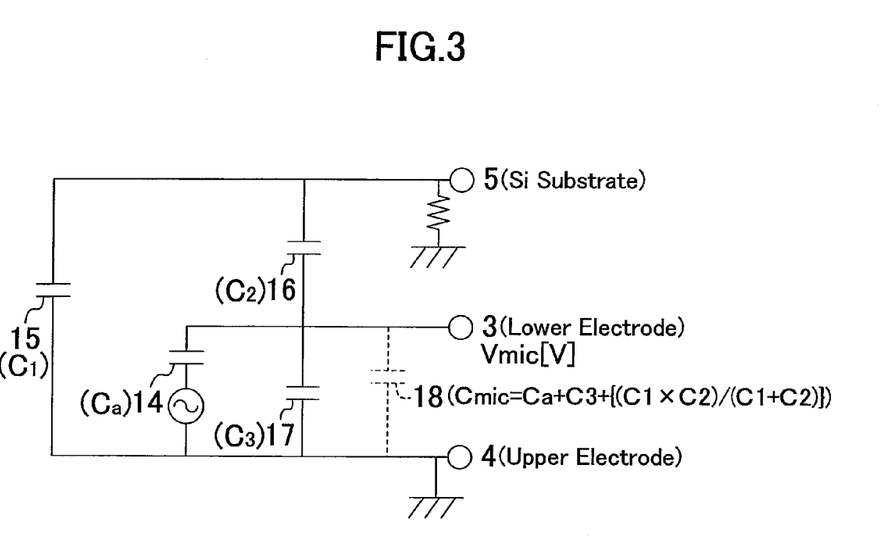
FIG. 3 is a diagram showing an equivalent circuit of the acoustic transducer of the embodiment of the present disclosure of FIG. 2.

FIG. 3 is a diagram showing an equivalent circuit of the acoustic transducer of this embodiment of FIG. 2. The circuit of FIG. 3 includes the capacitor 14 (air gap capacitance Ca), the capacitor 15 (parasitic capacitance $C_1$), the capacitor 16 (parasitic capacitance $C_2$), the capacitor 17 (parasitic capacitance $C_3$), the lower electrode 3 (voltage Vmic), the upper electrode 4 (ground voltage), and the silicon (Si) substrate 5. Here, the voltage Vmic of the lower electrode 3 is output as an electrical signal to the following circuit, such as an amplifier or the like. Also, although a rear surface of the silicon substrate 5 is attached directly to a printed substrate 22 having a ground potential (see FIG. 12B), the value of contact resistance between the silicon substrate 5 and the printed substrate 22 is large for a small voltage change, and therefore, it is not necessary to take the voltage of the silicon substrate 5 into consideration. Therefore, in the circuit of FIG. 3, the capacitor 14, the capacitor 17, and the series capacitance of the capacitors 15 and 16 are connected in parallel between the upper electrode 4 and the lower electrode 3. Therefore, a total capacitance Cmic between the upper electrode 4 and the lower electrode 3 (the capacitance of a virtual single capacitor 18) can be represented by:

$$Cmic = Ca + C_3 + \{(C_1 \times C_2)/(C_1 + C_2)\} \qquad (4)$$

As shown in expression (4), when the air gap capacitance Ca varies due to vibration of the vibrating film 2, Cmic also varies due to the variation of the air gap capacitance Ca, and therefore, the voltage Vmic of the lower electrode 3 also varies. In other words, a variation in the air gap capacitance Ca is converted into a variation in the voltage of the lower electrode 3, which is in turn input as a signal component to the following circuit. On the other hand, also when the parasitic capacitances $C_1$, $C_2$ and $C_3$ vary, Cmic also varies, and therefore, the voltage Vmic of the lower electrode 3 also varies. Here, $C_1$, $C_2$ and $C_3$ do not vary due to sound pressure and vary due to other factors, because of the respective capacitor structures. Therefore, a variation in Cmic due to the variation of $C_1$, $C_2$ and $C_3$ is input as a noise component of the voltage Vmic of the lower electrode 3 to the following circuit. In other words, although it is originally desirable to extract an output signal of the acoustic transducer which is proportional to a variation in the air gap capacitance Ca, from the lower electrode 3, this original purpose cannot be attained if the parasitic capacitances $C_1$, $C_2$ and $C_3$ vary significantly.

Incidentally, the parasitic capacitances $C_1$ and $C_2$ are capacitance values of MIS capacitances formed between the silicon substrate 5 and the upper electrode 4 and between the silicon substrate 5 and the lower electrode 3, respectively. The magnitudes of these capacitance values vary depending on a change in temperature or external light. Also, in the equivalent circuit of FIG. 3, the parasitic capacitances $C_1$ and $C_2$ are capacitances of the capacitors (15 and 16) coupled in series between the lower electrode 3 and the upper electrode 4. Therefore, if the total capacitance value of a series combination of $C_1$ and $C_2$ varies, the total capacitance Cmic varies, and therefore, a noise component occurs in the voltage Vmic of the lower electrode 3.

In contrast to this, according to this embodiment, by employing as the support substrate the n-type silicon substrate 5 in which electrons are majority carriers, it is possible to substantially prevent the formation of a depletion layer which is caused by positive charge at an interface between the silicon oxide film 6 and the silicon substrate 5 in the MIS structure having the parasitic capacitances $C_1$ and $C_2$. Therefore, the width of the depletion layer does not vary due to a change in the intensity of incident light or temperature, whereby the occurrence of noise, variations in sensitivity due to a change in temperature, and the like can be substantially prevented.

Figure 4:
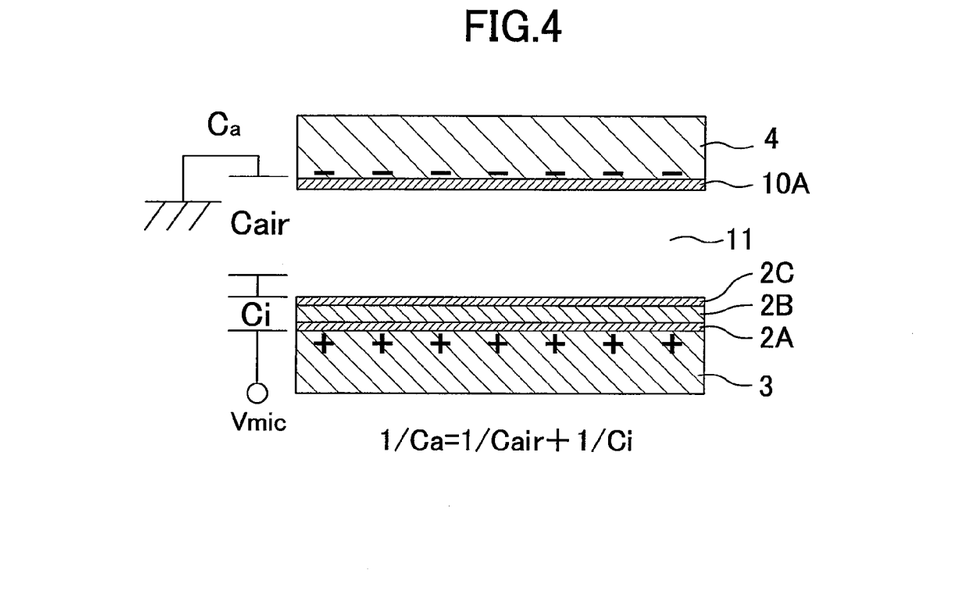
FIG. 4 is a diagram schematically showing a capacitor having an air gap capacitance Ca in the acoustic transducer of the embodiment of the present disclosure.

FIG. 4 is a diagram schematically showing a capacitor (capacitor 14) having the air gap capacitance Ca in the acoustic transducer of this embodiment. As shown in FIG. 4, the air gap capacitance Ca is created by the air gap 11 and the insulating films 2A, 2B, 2C and 10A being interposed by the upper electrode 4 and the lower electrode 3, which are capacitance electrodes. Therefore, the following expression is established.

$$1/Ca = 1/Cair + 1/Ci \qquad (5)$$

In expression (5), Cair is the value of capacitance created by the air gap 11, and Ci is the value of capacitance created by the insulating films 2A, 2B, 2C and 10A.

Figure 5:
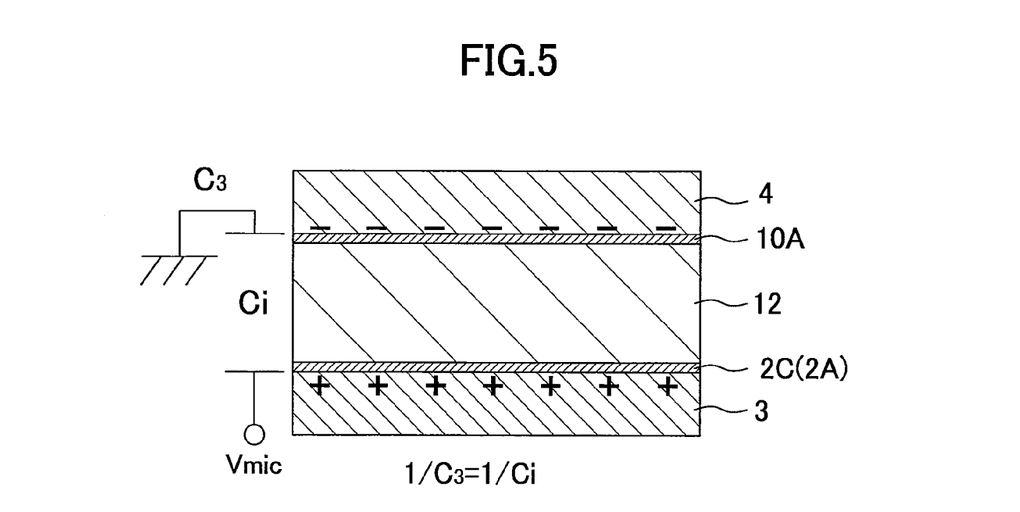
FIG. 5 is a diagram schematically showing a capacitor having a parasitic capacitance $C_3$ in the acoustic transducer of the embodiment of the present disclosure.

FIG. 5 is a diagram schematically showing a capacitor (capacitor 17) having the parasitic capacitance $C_3$ in the acoustic transducer of this embodiment. As shown in FIG. 5, the parasitic capacitance $C_3$ is created by the insulating films 2A, 2C and 10A and the silicon oxide film 12 being interposed between the upper electrode 4 and the lower electrode 3, which are capacitance electrodes. Therefore, the following expression is established.

$$1/C_3 = 1/Ci \qquad (6)$$

In expression (6), Ci is the value of the capacitance created by the insulating films 2A, 2C and 10A and the silicon oxide film 12.

Figure 6:
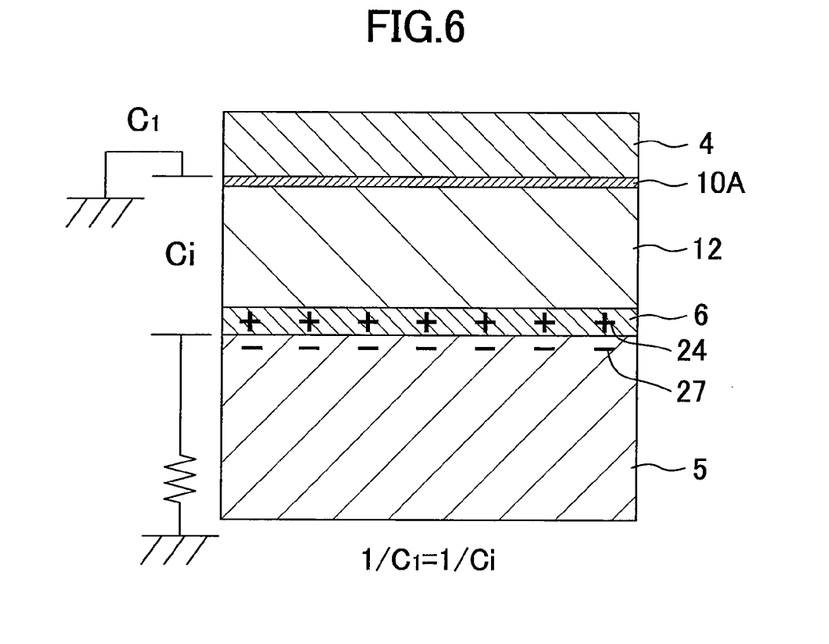
FIG. 6 is a diagram schematically showing a capacitor having a parasitic capacitance $C_1$ in the acoustic transducer of the embodiment of the present disclosure.

FIG. 6 is a diagram schematically showing a capacitor (capacitor 15) having the parasitic capacitance $C_1$ in the acoustic transducer of this embodiment. As shown in FIG. 6, the parasitic capacitance $C_1$ is created by the insulating film 10A and the silicon oxide films 6 and 12 being interposed between the upper electrode 4 and the N-type silicon substrate 5 (electrons are majority carriers), which are capacitance electrodes. Therefore, the following expression is established.

$$1/C_1 = 1/Ci \qquad (7)$$

In expression (7), Ci is the value of the capacitance created by the insulating film 10A and the silicon oxide films 6 and 12.

According to the acoustic transducer of this embodiment, as shown in FIG. 6, while interface charge 24 having positive charge is formed in the silicon oxide film 6 in the vicinity of an interface between the silicon oxide film 6 and the silicon substrate 5, N-type majority carriers 27 are accumulated in the silicon substrate 5 and electrically balance the interface charge 24, whereby a depletion layer is not formed. As a result, it is possible to substantially prevent the variation of the parasitic capacitance $C_1$ due to factors other than sound pressure, and therefore, it is advantageously possible to substantially prevent a noise component from being included in a variation in the voltage of the lower electrode 3 caused by the vibration of the vibrating film 2.

Figure 7:
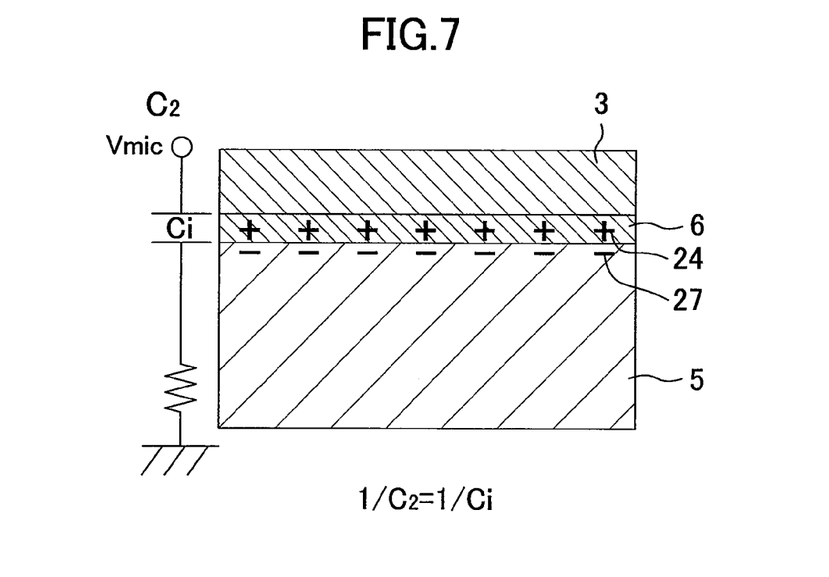
FIG. 7 is a diagram schematically showing a capacitor having a parasitic capacitance $C_2$ in the acoustic transducer of the embodiment of the present disclosure.

FIG. 7 is a diagram schematically showing a capacitor (capacitor 16) having the parasitic capacitance $C_2$ in the acoustic transducer of this embodiment. As shown in FIG. 7, the parasitic capacitance $C_2$ is created by the silicon oxide film 6 being interposed between the lower electrode 3 and the N-type silicon substrate 5 (electrons are majority carriers), which are capacitance electrodes. Therefore, the following expression is established.

$$1/C_2 = 1/Ci \qquad (8)$$

In expression (8), Ci is the value of the capacitance created by the silicon oxide film 6.

According to the acoustic transducer of this embodiment, as shown in FIG. 7, while interface charge 24 having positive charge is formed in the silicon oxide film 6 in the vicinity of an interface between the silicon oxide film 6 and the silicon substrate 5, N-type majority carriers 27 are accumulated in the silicon substrate 5 and electrically balance the interface charge 24, whereby a depletion layer is not formed. Specifically, according to the acoustic transducer of this embodiment, the silicon substrate 5 is of the N type and the majority carriers are electrons. Therefore, as compared to when a P-type silicon substrate is employed as the support substrate, majority carriers 27 having negative charge are easily collected in the vicinity of the interface between the silicon oxide film 6 and the silicon substrate 5, corresponding to the interface charge 24 having positive charge formed in the silicon oxide film 6, and therefore, a depletion layer is not formed in the silicon substrate 5 in the vicinity of the interface between the silicon oxide film 6 and the silicon substrate 5. Therefore, an electrical balance between the interface charge 24 and the majority carriers 27 is maintained, and therefore, the carrier equilibrium state is maintained even in the case of transfer between places having different illuminances or different temperatures. As a result, it is possible to substantially prevent the variation of the parasitic capacitance $C_2$ due to factors other than sound pressure, and therefore, it is advantageously possible to substantially prevent a noise component from being included in a variation in the voltage of the lower electrode 3 caused by the vibration of the vibrating film 2.

The parasitic capacitances $C_1$ and $C_2$ where the silicon substrate 5 of the acoustic transducer of this embodiment is replaced with a P-type silicon substrate 5A will be described hereinafter as a comparative example.

Figure 8:
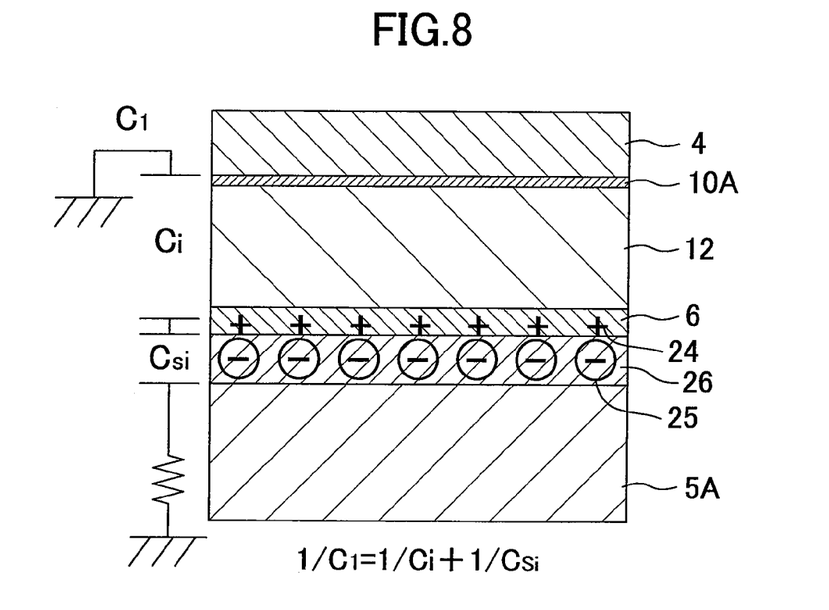
FIG. 8 is a diagram schematically showing a capacitor having a parasitic capacitance $C_1$ in an acoustic transducer according to a comparative example (acoustic transducer having a depletion layer).

FIG. 8 is a diagram schematically showing a capacitor (capacitor 15) having the parasitic capacitance $C_1$ in the acoustic transducer (acoustic transducer having a depletion layer) of the comparative example. As shown in FIG. 8, the parasitic capacitance $C_1$ is created by the insulating film 10A and the silicon oxide films 6 and 12 being interposed between the upper electrode 4 and the P-type silicon substrate 5A (holes are majority carriers), which are capacitance electrodes. Also, as shown in FIG. 8, while interface charge 24 having positive charge is formed in the silicon oxide film 6 in the vicinity of an interface between the silicon oxide film 6 and the P-type silicon substrate 5A, a depletion layer 26 is formed in the P-type silicon substrate 5A due to an influence of the interface charge 24. Here, acceptor atoms 25 having negative charge are present in the depletion layer 26, and an electrical balance is maintained between the acceptor atoms 25 and the interface charge 24. Therefore, the following expression is established.

$$1/C_1 = 1/Ci + 1/Csi \qquad (9)$$

In expression (9), Csi is the value of capacitance created by the depletion layer 26, and Ci is the value of capacitance created by the insulating films 10A and the silicon oxide films 6 and 12.

Figure 9:
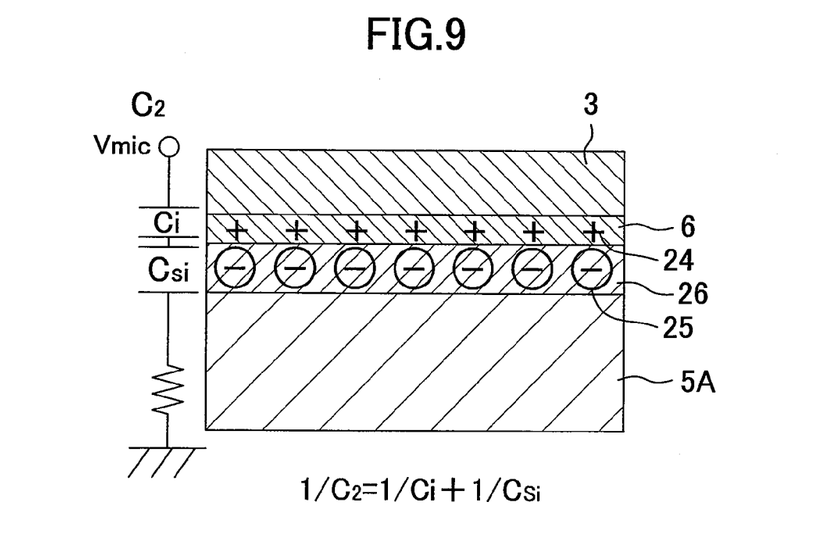
FIG. 9 is a diagram schematically showing a capacitor having a parasitic capacitance $C_2$ in the acoustic transducer of the comparative example (acoustic transducer having a depletion layer).

FIG. 9 is a diagram schematically showing a capacitor (capacitor 16) having the parasitic capacitance $C_2$ in the acoustic transducer (acoustic transducer having a depletion layer) of the comparative example. As shown in FIG. 9, the parasitic capacitance $C_2$ is created by the silicon oxide film 6 being interposed between the lower electrode 3 and the P-type silicon substrate 5A (holes are majority carriers), which are capacitance electrodes. Also, as shown in FIG. 9, while interface charge 24 having positive charge is formed in the silicon oxide film 6 in the vicinity of an interface between the silicon oxide film 6 and the P-type silicon substrate 5A, a depletion layer 26 is formed in the P-type silicon substrate 5A due to an influence of the interface charge 24. Here, acceptor atoms 25 having negative charge are present in the depletion layer 26, and an electrical balance is maintained between the acceptor atoms 25 and the interface charge 24. Therefore, the following expression is established.

$$1/C_2 = 1/Ci + 1/Csi \qquad (10)$$

In expression (10), Csi is the value of capacitance created by the depletion layer 26, and Ci is the value of capacitance created by the silicon oxide film 6.

Figure 10:
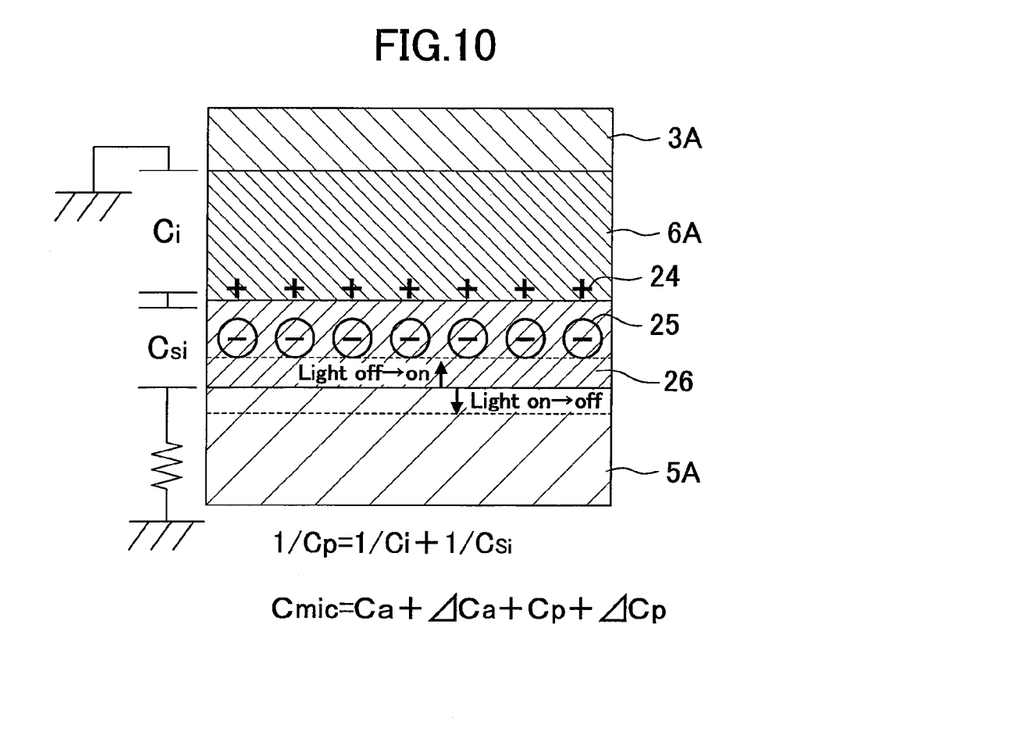
FIG. 10 is a diagram for describing a change in a parasitic capacitance Cp due to an external stimulus (e.g., light), where the parasitic capacitance Cp is of a capacitor in the acoustic transducer of the comparative example (acoustic transducer having a depletion layer).
Figure 11:
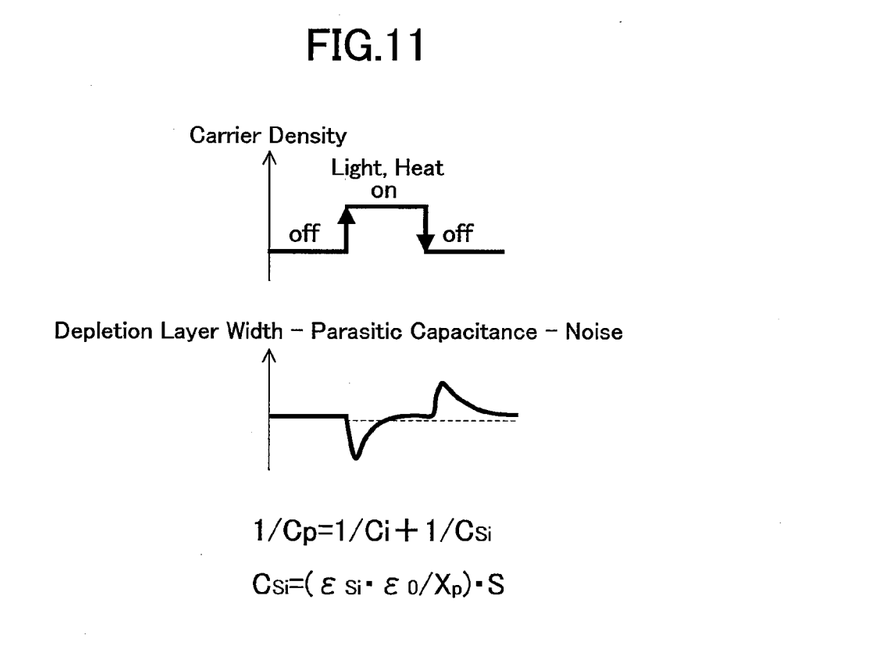
FIG. 11 is a diagram for describing both a relationship between an external stimulus (e.g., light) and the density of carriers and a relationship between the external stimulus and the width of a depletion layer, in the acoustic transducer of the comparative example (acoustic transducer having a depletion layer).

Next, an influence of an external stimulus, such as light, heat or the like, on a behavior or a characteristic of the parasitic capacitor of the acoustic transducer (acoustic transducer having a depletion layer) of the comparative example of FIGS. 8 and 9, will be described. FIG. 10 is a diagram for describing a change in a parasitic capacitance Cp due to an external stimulus (e.g., light), where the parasitic capacitance Cp is of a capacitor in the acoustic transducer having a depletion layer of the comparative example. Here, the capacitor having the parasitic capacitance Cp has basically the same structure as that of the capacitor having the parasitic capacitance $C_2$ of FIG. 9. Also, FIG. 11 is a diagram for describing both a relationship between an external stimulus (e.g., light) and the density of carriers and a relationship between the external stimulus and the width of a depletion layer, in the acoustic transducer having a depletion layer of the comparative example.

As shown in FIG. 10, the parasitic capacitance Cp is created by a silicon oxide film 6A being interposed between an electrode 3A and a P-type silicon substrate 5A (holes are majority carriers), which are capacitance electrodes. Also, as shown in FIG. 10, while interface charge 24 having positive charge is formed in the silicon oxide film 6A in the vicinity of an interface between the silicon oxide film 6A and the P-type silicon substrate 5A, a depletion layer 26 is formed in the P-type silicon substrate 5A due to an influence of the interface charge 24. Here, acceptor atoms 25 having negative charge are present in the depletion layer 26, and an electrical balance is maintained between the acceptor atoms 25 and the interface charge 24. Therefore, the following expression is established.

$$1/Cp = 1/Ci + 1/Csi \qquad (11)$$

In expression (11), Csi is the value of capacitance created by the depletion layer 26, and Ci is the value of capacitance created by the silicon oxide film 6A.

Also, Csi can be represented by:

$$Csi = (\in si \times \in 0 / Xp) \times S \qquad (12)$$

where $\in Si$ is the relative dielectric constant of silicon, $\in 0$ is the dielectric constant of vacuum, Xp is the width of the depletion layer, and S is the area of the depletion layer.

As can be seen from expression (11), the depletion layer capacitance Csi acts as a portion of the parasitic capacitance Cp. In the presence of a light source which emits light at a predetermined frequency, such as a fluorescent lamp, a non-equilibrium state occurs in the MIS structure due to carrier generation and annihilation accompanying ON/OFF of the light source, so that the width of the depletion layer undergoes modulation as shown in FIG. 11, and therefore, the magnitude of the parasitic capacitance varies periodically. Therefore, in capacitive devices such as acoustic transducers, the variation of the magnitude of the parasitic capacitance causes noise, leading to a reduction in S/N ratio characteristics.

Likewise, in the case of transfer between places having different illuminances or different temperatures, a non-equilibrium state occurs in the MIS structure due to carrier generation and annihilation, so that the width of the depletion layer undergoes modulation, and therefore, the magnitude of the parasitic capacitance varies, resulting in occurrence of noise.

For example, a capacitance Cmic of the acoustic transducer of the comparative example including a parasitic capacitor having a depletion layer is represented by:

$$Cmic = Ca + Cp \qquad (13)$$

where Ca is an air gap capacitance, and Cp is the value of capacitance of the parasitic capacitor having the depletion layer.

In an environment in which sound pressure is applied to the acoustic transducer of the comparative example, and at the same time, the depletion layer width Xp undergoes modulation due to a stimulus such as light, heat or the like, Cmic can be represented by:

$$Cmic = Ca + \Delta Ca + Cp + \Delta Cp \qquad (14)$$

where ΔCa is a signal component which is generated in response to the sound pressure, and ΔCp is a noise component which is caused by an external stimulus such as light, heat or the like.

In contrast to this, in this embodiment, the N-type silicon substrate 5 is employed as the support substrate of the MEMS device to provide the parasitic capacitor structure of FIGS. 6 and 7, whereby the noise component represented by ΔCp in expression (14) can be eliminated.

Specifically, according to expressions (4) and (14), Cmic in the presence of an external stimulus such as light, heat or the like in addition to sound pressure in the acoustic transducer of this embodiment can be represented by:

$$Cmic = Ca + \Delta Ca + C_3 + \Delta C_3 + \{((C_1 + \Delta C_1) \times (C_2 + \Delta C_2))/((C_1 + \Delta C_1) + (C_2 + \Delta C_2))\} \quad (15)$$

Here, as in this embodiment, the variation of the capacitance caused by an external stimulus such as light, heat or the like can be substantially prevented by arranging the parasitic capacitors $C_1$ and $C_2$ in a manner shown in FIGS. 6 and 7. In this case, Cmic can be represented by:

$$Cmic = Ca + \Delta Ca + C_3 + \{((C_1 \times C_2)/(C_1 + C_2)\}$$
$$= Ca + \Delta Ca + Cp \quad (16)$$

In other words, as can be seen in expression (16), the noise component due to the external stimulus can be eliminated.

Although the N-type silicon substrate 5 is employed as the support substrate in the acoustic transducer of this embodiment, a P-type silicon substrate (an intrinsic semiconductor may be employed: the same holds true in the description which follows) may be employed instead of the N-type silicon substrate 5, and an N-type impurity-containing region may be provided in the P-type silicon substrate at or in the vicinity of an interface between the P-type silicon substrate and the silicon oxide film 6. In this case, an advantage similar to that of this embodiment can be obtained. Thus, by providing the N-type impurity-containing region, a region containing N-type majority carriers can be formed. In this case, the concentration of N-type majority carriers in a portion of the P-type silicon substrate which contacts the silicon oxide film 6, is preferably higher than the concentration of N-type majority carriers in the other portion of the P-type silicon substrate. As a result, a depletion layer is not formed in the vicinity of the interface between the P-type silicon substrate and the silicon oxide film 6. Therefore, it is possible to substantially prevent the variation of the depletion layer capacitance due to an external stimulus such as light, heat or the like, whereby a noise component caused by an external stimulus can be reliably eliminated. Here, in order to ensure the advantage of the present disclosure, the N-type impurity concentration of the N-type impurity-containing region is preferably $1 \times 10^{14}$ cm$^{-3}$ or more and $1 \times 10^{21}$ cm$^{-3}$ or less. Also, examples of the N-type impurity contained in the N-type impurity-containing region include a phosphorus atom, an arsenic atom, and the like.

Also, in the acoustic transducer of this embodiment, the concentration of the N-type impurity in a portion of the N-type silicon substrate 5 employed as the support substrate where the N-type silicon substrate 5 contacts the silicon oxide film 6, may be higher than that in the other portion. As a result, the aforementioned advantage of this embodiment can be obtained to a further extent. Specifically, it is possible to substantially prevent a depletion layer from being formed in the silicon substrate 5 in the vicinity of an interface between the silicon substrate 5 and the silicon oxide film 6, and therefore, it is possible to substantially prevent the capacitance of the depletion layer from varying due to an external stimulus such as light, heat or the like. As a result, a noise component caused by an external stimulus can be reliably eliminated. Here, in order to reliably achieve the advantage of the present disclosure, the N-type impurity concentration of the high-concentration N-type impurity region provided in the N-type silicon substrate 5 is preferably $1 \times 10^{14}$ cm$^{-3}$ or more and $1 \times 10^{21}$ cm$^{-3}$ or less. Examples of the N-type impurity additionally introduced into the high-concentration N-type impurity region include a phosphorus atom, an arsenic atom and the like.

Incidentally, it is considered that, in a microphone module having an acoustic transducer, if a through hole (acoustic hole) is provided in a cover covering the acoustic transducer, a variation in the capacitance of the depletion layer due to light is significantly increased. This is because the acoustic transducer is directly irradiated with light through the through hole formed in the cover. Therefore, in such a case, the acoustic transducer of this embodiment is particularly advantageous.

A specific configuration of a microphone module including the acoustic transducer of this embodiment will be described hereinafter with reference to the drawings.

Figure 12A:
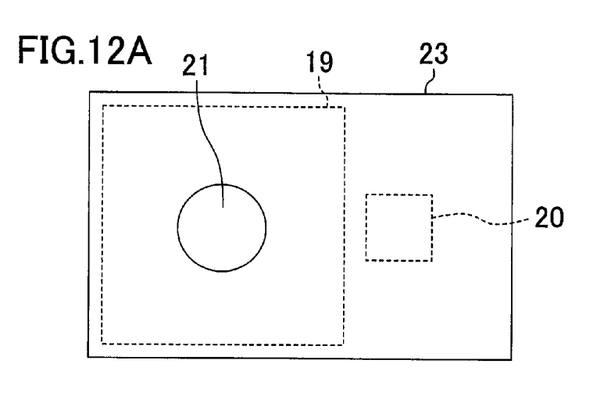
FIG. 12A is a top view of a microphone module including the acoustic transducer of the embodiment of the present disclosure.
Figure 12B:
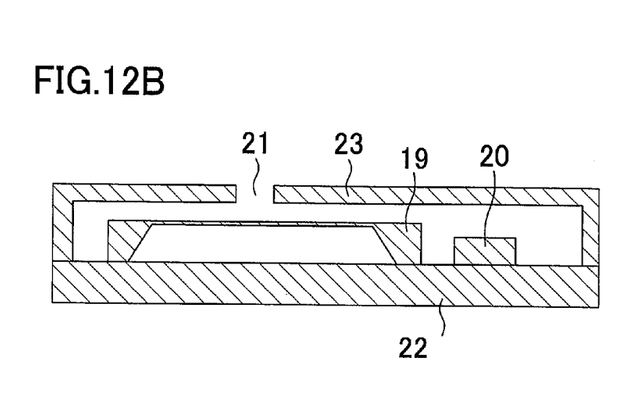
FIG. 12B is a cross-sectional view of the microphone module including the acoustic transducer of the embodiment of the present disclosure.
Figure 12C:
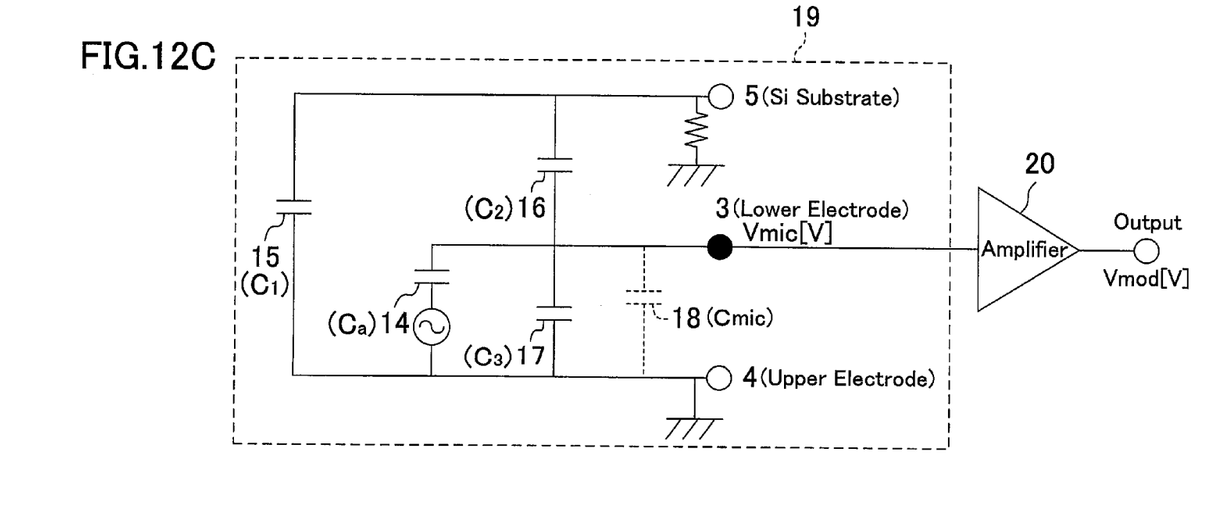
FIG. 12C is a circuit diagram of the microphone module including the acoustic transducer of the embodiment of the present disclosure.

FIGS. 12A to 12C are diagrams for describing the microphone module including the acoustic transducer of this embodiment. FIG. 12A is a top view. FIG. 12B is a cross-sectional view. FIG. 12C is a circuit diagram. Note that, in FIG. 12C, the same parts as those of the equivalent circuit of the acoustic transducer of this embodiment of FIG. 2 are indicated by the same reference symbols and will not be described.

As shown in FIGS. 12A and 12B, in the microphone module of this embodiment, an acoustic transducer 19 of this embodiment and an amplifier 20 are provided on a printed substrate 22, and a cover 23 is provided, covering the acoustic transducer 19 and the amplifier 20. A through hole (acoustic hole) 21 is provided in the cover 23 above the acoustic transducer 19 (specifically, the fixed film 10 (see FIG. 1)). Specifically, if the through hole 21 is provided immediately above the acoustic transducer 19, sound pressure can be transmitted to the acoustic transducer 19 without attenuation in the microphone module, and therefore, the microphone module can have a higher level of sensitivity. Moreover, a depletion layer is not formed in the silicon substrate 5 (see FIG. 1) which is the support substrate of the acoustic transducer 19 of this embodiment. Therefore, it is possible to substantially prevent the occurrence of noise, variations in sensitivity and the like due to a light source which emits light at a predetermined frequency, such as a fluorescent lamp, transfer between places having different illuminances, transfer between places having different temperatures, or the like.

In the circuit of FIG. 12C, when the voltage signal Vmic generated at the lower electrode 3 is input to the amplifier 20, the signal is amplified and the resultant signal is output as an electrical signal Vmod of the microphone module. Also in this case, a depletion layer is not formed in the silicon substrate 5 of the acoustic transducer 19 of this embodiment, and therefore, a noise component is not included in the voltage signal Vmic generated at the lower electrode 3. As a result, even if the voltage signal Vmic is amplified, the S/N ratio of the microphone module is advantageously not reduced.

Although the capacitive acoustic transducer has been described as subject matter in this embodiment, the present disclosure is not limited to this embodiment. Various changes and applications can be made without departing the spirit and scope of the present disclosure. Specifically, an advantage similar to that of this embodiment can also be achieved when the present disclosure is applied to other MEMS devices, such as a pressure sensor and the like, which have the same basic structure as that of the acoustic transducer of this embodiment. Note that, in the present disclosure, a technology of fabricating a device, such as a capacitive acoustic transducer, a pressure sensor or the like, by dividing a substrate (wafer) on which a large number of chips are fabricated by utilizing, for example, a manufacturing process technology for CMOS (complementary metal-oxide semiconductor) or the like, is referred to as a MEMS technology. A device which is fabricated by such a MEMS technology is referred to as a MEMS device. Also, needless to say, the present disclosure can be applied to various devices other than MEMS devices, such as a capacitive acoustic transducer, a pressure sensor and the like, without departing from the spirit and scope of the present disclosure.

What is claimed is:

1. An acoustic transducer comprising:
a semiconductor substrate;
a movable electrode formed above the semiconductor substrate;
a fixed electrode formed above the semiconductor substrate;
a first insulating film provided between the semiconductor substrate and a portion of the movable electrode; and
a second insulating film provided between the semiconductor substrate and a portion of the fixed electrode,
wherein:
the semiconductor substrate, the first insulating film and the movable electrode comprise a first MIS structure,
the semiconductor substrate, the second insulating film and the fixed electrode comprise a second MIS structure,
an interface charge having a first polarity is present at an interface between the semiconductor substrate and at least one of the first insulating film and the second insulating film,
the semiconductor substrate has, as majority carriers, carriers having a second polarity different from the first polarity, and
the interface charge having the first polarity is present in the first insulating film in a vicinity of the interface between the semiconductor substrate and the first insulating film.

2. The acoustic transducer of claim 1, wherein the semiconductor substrate is a silicon substrate having a region containing N-type majority carriers.

3. The acoustic transducer of claim 2, wherein:
the silicon substrate contacts the first insulating film, and
the region containing N-type majority carriers is provided in at least a portion of the silicon substrate in which the silicon substrate contacts the first insulating film.

4. The acoustic transducer of claim 3, wherein a concentration of N-type majority carriers in the portion of the semiconductor substrate where the semiconductor substrate contacts the first insulating film is higher than a concentration of N-type majority carriers in other portions of the semiconductor substrate.

5. The acoustic transducer of claim 2, wherein the silicon substrate is an N-type silicon substrate.

6. The acoustic transducer of claim 1, wherein:
the movable electrode and the fixed electrode constitute a condenser structure, and
a capacitance of the condenser structure varies due to vibration of the movable electrode which is caused in response to sound pressure.

7. The acoustic transducer of claim 1, wherein, the doping of the substrate does not contribute to the presence of the interface charge in the first insulating film.

8. The acoustic transducer of claim 7, wherein the semiconductor substrate is a silicon substrate having a region containing N-type majority carriers.

9. The acoustic transducer of claim 8, wherein:
the silicon substrate contacts the first insulating film, and
the region containing N-type majority carriers is provided in at least a portion of the silicon substrate in which the silicon substrate contacts the first insulating film.

10. The acoustic transducer of claim 9, wherein a concentration of N-type majority carriers in the portion of the semiconductor substrate where the semiconductor substrate contacts the first insulating film is higher than a concentration of N-type majority carriers in the other portion of the semiconductor substrate.

11. The acoustic transducer of claim 8, wherein the silicon substrate is an N-type silicon substrate.

12. The acoustic transducer of claim 7, wherein:
the movable electrode and the fixed electrode constitute a condenser structure, and
a capacitance of the condenser structure varies due to vibration of the movable electrode which is caused in response to sound pressure.

* * * * *